(12) United States Patent
Kakimoto

(10) Patent No.: US 8,232,232 B2
(45) Date of Patent: Jul. 31, 2012

(54) OXIDE TARGET FOR LASER VAPOR DEPOSITION AND METHOD OF MANUFACTURING THE SAME

(75) Inventor: Kazuomi Kakimoto, Tokyo (JP)

(73) Assignee: Fujikura Ltd., Tokyo (JP)

( * ) Notice: Subject to any disclaimer, the term of this patent is extended or adjusted under 35 U.S.C. 154(b) by 588 days.

(21) Appl. No.: 12/392,211

(22) Filed: Feb. 25, 2009

(65) Prior Publication Data

US 2009/0215630 A1    Aug. 27, 2009

(30) Foreign Application Priority Data

Feb. 27, 2008   (JP) ................. 2008-046048

(51) Int. Cl.
 C23C 14/28   (2006.01)
 C04B 35/45   (2006.01)

(52) U.S. Cl. ........ 505/511; 505/234; 505/236; 428/469; 428/472; 204/298.12; 204/298.13; 228/122.1; 228/194; 228/262.1; 419/9; 419/19; 419/48; 264/109; 264/114

(58) Field of Classification Search ............ 428/469, 428/697, 701, 702; 204/298.12, 298.13, 204/298.15; 228/101, 193, 194, 195; 419/8, 419/19

See application file for complete search history.

(56) References Cited

U.S. PATENT DOCUMENTS

2008/0121521 A1 * 5/2008 Chung et al. ............. 204/298.12

FOREIGN PATENT DOCUMENTS

| JP | 57-062518 | * | 4/1982 |
| JP | 57-62518 A | | 4/1982 |
| JP | 59-232270 A | | 12/1984 |
| JP | 63-270459 | * | 11/1988 |
| JP | 63-270459 A | | 11/1988 |
| JP | 63270459 | * | 11/1988 |
| JP | 04-202067 | * | 7/1992 |
| JP | 6-2126 A | | 1/1994 |
| JP | 10-046329 | * | 2/1998 |
| JP | 2005-112677 | * | 4/2005 |

OTHER PUBLICATIONS

European Search Report dated May 25, 2009, issued in corresponding European Patent Application No. 09250509.

* cited by examiner

*Primary Examiner* — Stanley Silverman
*Assistant Examiner* — Kallambella Vijayakumar
(74) *Attorney, Agent, or Firm* — Westerman, Hattori, Daniels & Adrian, LLP

(57) ABSTRACT

An oxide target for laser vapor deposition, which is used when an oxide film is formed in a laser vapor deposition system, including: a fixed plate, an Ag-soldering layer bonded onto the fixed plate, an oxide-Ag mixed layer bonded onto the Ag-soldering layer; and an oxide layer bonded onto the oxide-Ag mixed layer.

4 Claims, 1 Drawing Sheet

US 8,232,232 B2

OXIDE TARGET FOR LASER VAPOR DEPOSITION AND METHOD OF MANUFACTURING THE SAME

CROSS-REFERENCE TO RELATED APPLICATIONS

This application claims priority from Japanese Patent Application No. 2008-046048, filed in the Japanese Patent Office on Feb. 27, 2008, the disclosure of which is incorporated herein by reference.

BACKGROUND OF THE INVENTION

1. Field of the Invention

The present invention relates to an oxide target and a method of manufacturing the same, which is used for a laser vapor deposition system, in which a laser beam is irradiated on a target to generate fine particles of an oxide from the surface of the target, and the fine particles are deposited on the surface of a substrate to form an oxide film on the surface of the substrate, thus providing an extending the lifetime of the target.

2. Description of the Related Art

As one example of a target for a vapor deposition system intended for vapor deposition of an oxide on the surface of a substrate, for example, (Japanese Unexamined Patent Application, First Publication No. H06-2126 discloses a method for bonding a sputtering target material by heating and then cooling a soldering material between a target material and a cooling member made from stainless steel for solder-bonding. In this bonding method, vapor deposition is carried out on the target material and the cooling member to bond stainless steel (which is hereinafter referred to SUS), which is a hard-to-bond material, to a target.

The sputtering target as described in the above-described patent document uses a bonding material for a metal target used for sputter vapor deposition and a metal plate, and is provided with a cooling system. As such, in a case of bonding between materials having good states and properties, particularly, there has been no problem in the target bonding.

The above patent document is a related art concerning a metal target used for a sputtering method, but, as shown in FIG. 1, similar attempts have been also made on an oxide target used for laser vapor deposition as another film forming technique.

FIG. 1 is a schematic diagram for illustrating a laser vapor deposition system using a conventional oxide target, wherein a symbol 1 denotes an oxide target, a symbol 2 denotes an Ag vapor-deposited film, a symbol 3 denotes an In soldering, a symbol 4 denotes a Cu-fixed plate, a symbol 5 denotes a SUS holder, a symbol 6 denotes a heater box, symbols 7 and 8 denote reels, a symbol 9 denotes a tape substrate, a symbol 10 denotes a plume, and a symbol 11 denotes a laser beam. In this laser vapor deposition system, a tape substrate 9 is disposed between the reels 7 and 8 in the heater box 6. In this laser vapor deposition system, the laser beam 11 is irradiated on the target 1 disposed under the heater box 6 to generate oxide fine particles from the surface of the oxide target 1 while the oxide target 1 is being moved in one direction. As a rest the fine particles are deposited on the surface of the substrate of the oxide target 1 to form an oxide film on the surface of the substrate. As used herein, the structure of the oxide target 1 is such that the Cu-fixed plate 4, the In soldering 3, the Ag vapor-deposited film 2, and the oxide target 1 are bonded in is order onto the SUS holder 5, which can be cooled by circulating cooling water.

However, in a case where the oxide target 1 described above is used, there are problems in that the oxide target 1 is easily cleaved, and that cleavage or cracks easily occur due to the dramatic change in temperatures, or the like. Furthermore, since wettability of both materials with the oxide target 1 and the Ag vapor-deposited film 2 is poor, the oxide target 1 is peeled off from the body of the target, thereby leading to a problem in that film formation could not be stably carried out for a long period of time.

The present invention has been made taking the above-described problems into consideration, and thus it is an object thereof to provide an oxide target for laser vapor deposition and a method of manufacturing the same that is capable of stably carrying out film formation by extending the lifetime of a target in the oxide target used for the laser vapor deposition system.

SUMMARY OF THE INVENTION

In order to accomplish the above object, the present invention provides the following aspects:

(1) A first aspect of the present invention is an oxide target for laser vapor deposition, which is used when an oxide film is formed in a laser vapor deposition system, including: a fixed plate, an Ag-soldering layer bonded onto the fixed plate, an oxide-Ag mixed layer bonded onto the Ag-soldering layer; and an oxide layer bonded onto the oxide-Ag mixed layer.

(2) In the oxide target for laser vapor deposition as described in (1), it is preferable that the oxide-Ag mixed layer has a ratio by volume of Ag in a range of from 5 to 20%.

(3) In the oxide target for laser vapor deposition as described in (1), it is preferable that the oxide-Ag mixed layer has a thickness of 0.5 mm or more.

(4) In the oxide target for laser vapor deposition as described in (1), it is preferable that the oxides of the oxide layer and the oxide-Ag mixed layer are oxide superconductive materials.

(5) A second aspect of the present invention is a method for manufacturing an oxide target for laser vapor deposition, which is used when an oxide film is formed in a laser vapor deposition system, including the successive steps of: bonding an Ag-soldering layer onto a fixed plate, bonding an oxide-Ag mixed layer onto the Ag-soldering layer; and bonding an oxide layer onto the oxide-Ag mixed layer.

(6) In the method for manufacturing an oxide target for laser vapor deposition as described in (5), the oxide-Ag mixed layer is formed by compression-molding the oxide powders and the Ag powder to form a compressed-molded compact, followed by sintering the compressed-molded object.

In the oxide target for laser vapor deposition of the present invention as described in (1) and the method of manufacturing the same as described in (5), an Ag-soldering layer is bonded onto a fixed plate, an oxide-Ag mixed layer is bonded onto the Ag-soldering layer, and an oxide layer is bonded onto the oxide-Ag mixed layer. By sintering the oxide-Ag mixed layer and the oxide layer for bonding, the oxide in the oxide-Ag mixed layer and the oxide layer are firmly sintered to each other. Furthermore, concurrently to the sintering, by metal-bonding the Ag in the oxide-Ag mixed layer and the Ag-soldering layer, the oxide layer on the surface can be firmly fixed on the body of the target, thereby making it hard to peel off the oxide layer. As a result, a film structure can be stably maintained for a long period of time.

Furthermore, in the method manufacturing the oxide target for laser vapor deposition of the present invention, since Ag in the oxide-Ag mixed layer and the Ag-soldering layer has a heat resistance temperature as high as 900° C., it can be used without cooling a target even in laser vapor deposition with a film formation temperature as high as 800° C. As a result, the temperature distribution of the surface of the tape upon film formation can be kept good, thereby forming a high quality oxide film.

DETAILED DESCRIPTION OF THE INVENTION

Hereinbelow, the embodiments of the present invention will be described with reference to the accompanying drawings.

Figure 2:
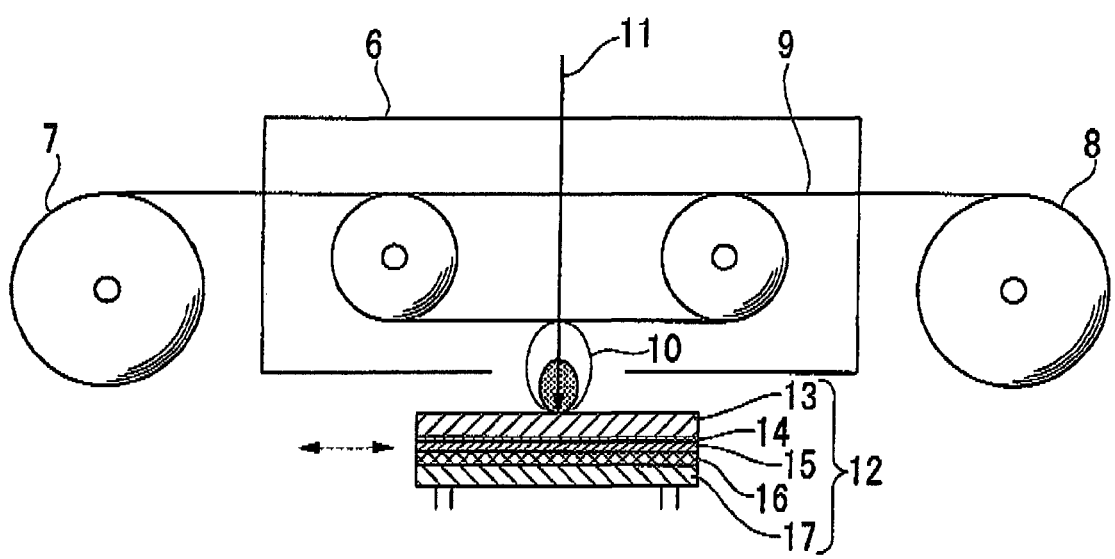
FIG. 2 is a schematic diagram of a laser vapor deposition system provided with the oxide target for laser vapor deposition of a first embodiment of the present invention.

FIG. 2 is a schematic diagram of a laser vapor deposition system provided with an oxide target for laser vapor deposition of a first embodiment of the present invention. In FIG. 2, a symbol 6 denotes a heater box, symbols 7 and 8 denote reels, a symbol 9 denotes a tape substrate, a symbol 10 denotes a plume, a symbol 11 denotes a laser beam, a symbol 12 denotes an oxide target for laser vapor deposition, a symbol 13 denotes an oxide layer, a symbol 14 denotes an oxide-Ag mixed layer, a symbol 15 denotes an Ag-soldering layer, a symbol 16 denotes an Ni-based alloy fixed plate, and a symbol 17 denotes an SUS holder.

The oxide target 12 for laser vapor deposition (hereinafter abbreviated as a target 12) of the present embodiment is an oxide target used for a laser vapor deposition system (not illustrated), in which a laser beam 11 is irradiated onto the target 12 to generate fine particles of an oxide from the surface of the target 12, and the fine particles are deposited on the surface of a substrate (not illustrated) to form an oxide film (not illustrated) on the surface of the substrate. In the oxide target 12, the Ni-based alloy fixed plate 16 is fixed on the SUS holder 17, and the Ag-soldering layer 15 is bonded onto the Ni-based alloy fixed plate 16. Furthermore, the oxide-Ag mixed layer 14 is bonded onto the Ag-soldering layer 15, and the oxide layer 13 is bonded onto the oxide-Ag mixed layer 14.

The oxides in the oxide layer 13 and the oxide-Ag mixed layer 14 are preferably of the same kinds of oxide materials. This oxide is an oxide material allowing film formation on the surface of a tape substrate 9, and can be selected from various oxide materials according to the purposes of film formation, and then used. Examples thereof include intermediate layer materials such as magnesium oxide and zirconium oxide, and oxide superconductive materials. Examples of these oxide superconductive materials include rare earth element-based oxide superconductors such as Y—Ba—Cu—O.

The oxide-Ag mixed layer 14 is made by uniformly mixing the oxide powders and a predetermined amount of Ag powder, and then compression-molding these mixed materials into a plate shape with a desired thickness (a compressed-molded compact). The oxide-Ag mixed layer 14 is interposed between the Ag-soldering layer 15 of the target and the oxide layer 13, and the laminated layers of the oxide-Ag mixed layer 14, the Ag-soldering layer 15 and the oxide layer 13 are all heat-treated to a sintering temperature of the oxide to firmly sinter the oxide in the oxide-Ag mixed layer 14 and the oxide layer 13, as well as to metal-bond the Ag in the oxide-Ag mixed layer 14 to the Ag-soldering layer 15. As a result, the oxide layer 13 can be firmly fixed on the body of the target 12. However, Ag is uniformly dispersed in the oxide-Ag mixed layer 14.

This oxide-Ag mixed layer 14 preferably has a thickness of 0.5 mm or more. Furthermore, the oxide-Ag-mixed layer 14 preferably has a ratio by volume of Ag in a range of from 5 to 20%.

With each of the thickness of the oxide-Ag mixed layer 14 and the ratio by volume of Ag in the above range, the oxide layer 13 is hard to be peeled off, and an endurance time of the bonded part of the target can be greatly increased. As a result, film structure can be stably maintained for a long period of time.

In the target 12 of the present embodiment, the Ag-soldering layer 15 is bonded onto the Ni-based alloy fixed plate 16 on the body of the target, the oxide-Ag mixed layer 14 is bonded onto the Ag-soldering layer 15, and the oxide layer 13 is bonded onto the oxide-Ag mixed layer 14. In this structure, the oxide-Ag mixed layer 14 and the oxide layer 13 are sintered and bonded to each other to firmly sinter the oxide in the oxide-Ag mixed layer 14 and the oxide layer 13, as well as to metal-bond the Ag in the oxide-Ag mixed layer 14 to the Ag-soldering layer 15. As a result, the oxide layer 13 of the surface can be firmly fixed on the body of the target thereby making the oxide layer 13 difficult to be peeled, and thus film structure can be stably maintained for a long period of time.

Furthermore, since the Ag in the oxide-Ag mixed layer 14 and the Ag-soldering layer 15 has a heat resistance temperature as high as 900° C., it can be used without cooling a target even in laser vapor deposition with a film formation temperature as high as 800° C. As a result, the distribution of temperatures of the surface of the tape substrate 9 upon film formation can be kept good, thereby forming a high quality oxide film.

EXAMPLES

By using a Y—Ba—Cu—O— based oxide superconductor as an oxide, only this oxide superconductive material was compression-molded to prepare an oxide layer 13 having a plane shape.

Further, this oxide superconductive material was mixed with Ag powder at a ratio as described in "ratios (%) by volume of Ag/oxide" in Table 1, followed by compression-molding, and the thickness after final sintering was adjusted to give a thickness as described in "thickness of oxide-Ag mixed layer" in Table 1, to prepare various oxide-Ag mixed layers 14.

The oxide layer 13 and the oxide-Ag bulk products were repeatedly put into a sintering furnace to sinter them at 900° C. for 24 hours, and the sintered products were silver soldered onto the Ni-based alloy fixed plate 16.

The oxide-Ag mixed layers having different thicknesses and ratios by volume of Ag were used as shown in FIG. 2 to prepare an target 12, in which the SUS holder 17, the Ni-based alloy fixed plate 16, the Ag-soldering layer 15, the oxide-Ag mixed layer 14, and the oxide layer 13 were laminated in this order. In the resulting oxide target 12 for laser vapor deposition, the oxide in the oxide-Ag mixed layer 14 and the oxide layer 13 were firmly sintered to each other, as well as the Ag in the oxide-Ag mixed layer 14 being metal-bonded to the Ag-soldering layer 15, thereby firmly fixing the oxide layer 13 on the body of the target 12.

Here, as the tape substrate 9, a tape was used in which an IBAD intermediate layer composed of $Gd_2Zr_2O_7$ had been formed on a surface of a tape substrate manufactured by Hastelloy according to an ion-beam-assisted vapor deposition (IBAD) method and a CeO$_2$ intermediate layer had been formed on a surface of the IBAD intermediate layer according to a pulse laser vapor deposition method. This tape substrate 9 was set between the reels 7 and 8, as shown in FIG. 2, to pass through the inside of the heater box 6.

The target 12 prepared as described above was attached on the bottom of the heater box 6, and a pulse laser beam from a pulse laser beam source (not shown) was irradiated to the oxide layer 13 of the target 12 while not cooling the SUS holder 17, and oxide fine particles were deposited on the surface of the tape substrate 9 moving in one direction to prepare an oxide superconductive tape. Here, the temperature for film formation was 800° C.

When the oxide layer 13 is set to have a thickness of 10 mm, the limit of its use in terms of time is 100 hours. In the present Example, the target 12 (Sample No. 1-10) that had been prepared by using the oxide-Ag mixed layers having different thicknesses and ratios by volume of Ag was used to prepare an oxide superconductive tape, and cleavage or peeling of the target was caused to examine the time until film formation could not be stably carried out (which is hereinafter referred to as "endurance time of the bonded part of the target"). Further, the resulting oxide superconductive tape was cut into parts (length 500 mm) to measure a critical current density (Jc) of short wires at a liquid nitrogen temperature (which is hereinafter referred to as "short Jc"). The results thereof are summed up in Table 1.

Figure 1:
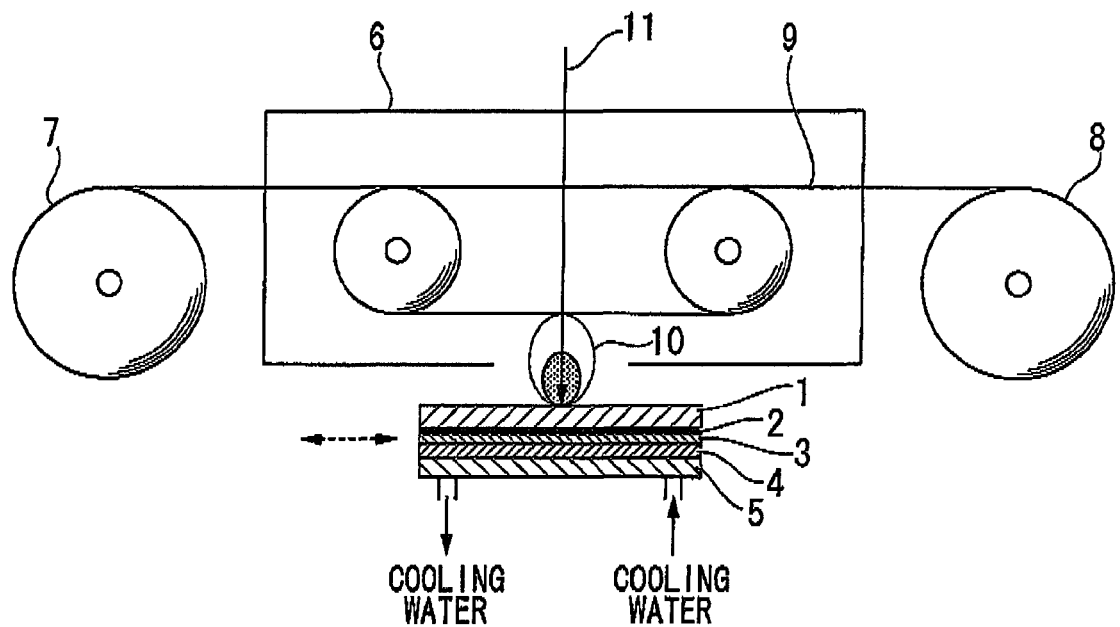
FIG. 1 is a schematic diagram illustrating a laser vapor deposition system using a related art of an oxide target.

For Comparative Example, an oxide superconductive tape was prepared in the same manner as in Example, except that a comparative target (Sample No. 11 in Table 1) was used in which the Cu-fixed plate 4, the In soldering 3, the Ag vapor-deposited film 2, and the oxide target 1 composed of the oxide superconductive material were bonded in this order onto the SUS holder 5 which can be cooled by circulating cooling water, was prepared as shown in FIG. 1. The result is shown in Table 1 as 'Comparative Example'.

TABLE 1

| No. | Ratio by volume of Ag/oxide (%) | Thickness (mm) of oxide-Ag mixed layer | Endurance time (h) of bonded part of target | Short Jc (A/cm$^2$) |
| --- | --- | --- | --- | --- |
| 1 | 1 | 0.0 | 0 | 0 |
| 2 | 1 | 0.1 | 1 | 1.9 |
| 3 | 1 | 0.3 | 20 | 2.1 |
| 4 | 1 | 0.5 | 50 | 2.0 |
| 5 | 1 | 1.0 | 50 | 2.1 |
| 6 | 5 | 0.5 | 100 | 2.0 |
| 7 | 10 | 0.5 | 100 | 1.9 |
| 8 | 20 | 0.5 | 100 | 2.1 |
| 9 | 50 | 0.5 | 70 | 2.0 |
| 10 | 70 | 0.5 | 20 | 2.0 |
| 11 | Comparative Example | | 20 | 1.5 |

From the results in Table 1, when the ratio by volume of the Ag/oxide in the oxide-Ag mixed layer 14 was 1%, the endurance time of the bonded part of the target was not changed with a thickness of the oxide-Ag mixed layer 14 of 0.5 mm or more. This confirmed that upon compression-molding of the target, a minimum thickness of 0.5 mm is required in order to keep stable the thickness of the oxide-Ag mixed layer 14.

Further, by providing a unity in the thickness of the oxide-Ag mixed layer 14 of 0.5 mm, when the ratio by volume of the Ag/oxide was in a range between 5 and 20% set with the change in the ratios by volume of Ag/oxide, the endurance time of the bonded part of the target could be kept up to the life time of the target (100 hours). To the contrary, with the ratio by volume of Ag/oxide exceeding 20%, the interface between the oxide layer 13 and the oxide-Ag mixed layer 14 was easily peeled off, and accordingly, there was a tendency of reduced endurance time.

In addition, considering the critical current density (Jc) characteristics of the actually prepared short wires, it can be seen that Examples (Sample No. 1-10) related to the invention provide improved Jc characteristics as compared with Comparative Example (Sample No. 11). Thus, since cooling water for the target was not used for the target in the present Example, an effect of uniform temperature distribution of the surface of the tape upon film formation could be obtained.

While preferred embodiments of the invention will be described and illustrated below, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An oxide target for laser vapor deposition, which is used when an oxide film is formed in a laser vapor deposition system, comprising:
    a fixed plate;
    an Ag-soldering layer bonded onto the fixed plate;
    an oxide-Ag mixed layer bonded onto the Ag-soldering layer; and
    an oxide layer bonded onto the oxide-Ag mixed layer, wherein
    Ag in the oxide-Ag mixed layer and the Ag-soldering layer has a heat resistance temperature as high as 900° C., and wherein
    by sintering the oxide-Ag mixed layer and the oxide layer for bonding, the oxide in the oxide-Ag mixed layer and the oxide layer are firmly sintered to each other, and concurrently to the sintering, by metal-bonding the Ag in the oxide-Ag mixed layer and the Ag-soldering layer, the oxide layer on the surface is firmly fixed on the body of the target, and wherein
    the oxide-Ag mixed layer has a ratio by volume of Ag in a range of from 5 to 20%.

2. The oxide target for laser vapor deposition according to claim 1,
    wherein the oxide-Ag mixed layer has a thickness of 0.5 mm or more.

3. The oxide target for laser vapor deposition according to claim 1,
    wherein the oxides of the oxide layer and the oxide-Ag mixed layer are oxide superconductive materials.

4. A method for manufacturing an oxide target for laser vapor deposition, which is used when an oxide film is formed in a laser vapor deposition system, the method comprising the steps of:
    bonding an Ag-soldering layer onto a fixed plate;
    bonding an oxide-Ag mixed layer onto the Ag-soldering layer; and
    bonding an oxide layer onto the oxide-Ag mixed layer, wherein
    the method further comprises the step of forming the oxide-Ag mixed layer before the step of bonding an oxide-Ag mixed layer onto the Ag-soldering layer, the step of the oxide-Ag mixed layer formation including:
    compression-molding the oxide powders and the Ag powder so as to form a compressed-molded compact; and
    sintering the compressed-molded compact.

* * * * *